(12) United States Patent
Fan et al.

(10) Patent No.: US 11,146,250 B2
(45) Date of Patent: Oct. 12, 2021

(54) PULSE VOLTAGE GENERATION DEVICE, METHOD, AND CONTROLLER

(71) Applicant: Suzhou Powersite Electric Co., Ltd., Suzhou (CN)

(72) Inventors: Shengfang Fan, Suzhou (CN); Qiang Huang, Suzhou (CN); Fei Chen, Suzhou (CN); Xiaosen Chen, Suzhou (CN); Jie He, Suzhou (CN)

(73) Assignee: Suzhou Powersite Electric Co., Ltd., Suzhou (CN)

( * ) Notice: Subject to any disclaimer, the term of this patent is extended or adjusted under 35 U.S.C. 154(b) by 0 days.

(21) Appl. No.: 16/766,365

(22) PCT Filed: Nov. 16, 2018

(86) PCT No.: PCT/CN2018/115956
§ 371 (c)(1),
(2) Date: May 22, 2020

(87) PCT Pub. No.: WO2019/105242
PCT Pub. Date: Jun. 6, 2019

(65) Prior Publication Data
US 2020/0350896 A1 Nov. 5, 2020

(30) Foreign Application Priority Data
Nov. 29, 2017 (CN) .......................... 201711221350.0

(51) Int. Cl.
*H02K 3/02* (2006.01)
*H03K 3/02* (2006.01)
(Continued)

(52) U.S. Cl.
CPC ................ *H03K 3/02* (2013.01); *H02M 1/00* (2013.01); *H02M 7/04* (2013.01); *H02M 7/44* (2013.01); *H02M 1/007* (2021.05)

(58) Field of Classification Search
CPC ............ H02M 7/04; H02M 7/44; H02M 1/00; H02M 9/04; H02M 2001/007; H02M 2001/0077; H02K 3/02
See application file for complete search history.

(56) References Cited

U.S. PATENT DOCUMENTS

2002/0041242 A1* 4/2002 Takahashi ........... H03M 1/1071
341/120
2003/0103360 A1 6/2003 Hatta et al.
(Continued)

FOREIGN PATENT DOCUMENTS

CN 106787928 A 5/2017
CN 106787928 A 5/2017
(Continued)

OTHER PUBLICATIONS

Written Opinion for PCT Application No. PCT/CN2018/115956 dated Feb. 1, 2019.
(Continued)

*Primary Examiner* — Adolf D Berhane
(74) *Attorney, Agent, or Firm* — Chambliss, Bahner & Stophel, P.C.

(57) ABSTRACT

The present application discloses a pulse voltage generation device, method and controller, the device comprises: a transformer; a first AC/DC conversion circuit, with an alternating current side connected with a high-voltage side of the transformer; an energy storage capacitor, connected with a direct current side of the a first AC/DC conversion circuit, for storing electrical energy; and a discharge control circuit, in parallel connection with both ends of the energy storage capacitor, for controlling discharge of the energy storage capacitor to generate a high-voltage pulse. In the present application, an energy storage capacitor is arranged on a high-voltage side of the transformer, and a discharge control circuit is used to control the energy storage capacitor
(Continued)

to discharge to generate a high-voltage pulse, avoiding the problem that frequency of the high-voltage pulse outputted on the high-voltage side is limited by variations of the induced magnetic field of the transformer, and is thus difficult to increase, and that the rising edge and falling edge of the high-voltage pulse take a long time.

11 Claims, 6 Drawing Sheets

(51) Int. Cl.
*H02M 1/00* (2006.01)
*H02M 7/04* (2006.01)
*H02M 7/44* (2006.01)

(56) References Cited

U.S. PATENT DOCUMENTS

| | | | | |
|---|---|---|---|---|
| 2007/0147098 | A1* | 6/2007 | Mori | H02J 3/1857 363/71 |
| 2010/0259955 | A1* | 10/2010 | Shimada | H02M 7/219 363/49 |
| 2013/0051082 | A1* | 2/2013 | Lee | H02M 3/285 363/17 |
| 2015/0049525 | A1 | 2/2015 | Mu et al. | |
| 2015/0061496 | A1* | 3/2015 | Hanna | H01J 37/08 315/111.81 |
| 2015/0078046 | A1* | 3/2015 | Gupta | H02J 3/36 363/69 |
| 2017/0295634 | A1* | 10/2017 | Garcia Tormo | H05G 1/58 |
| 2018/0109199 | A1* | 4/2018 | Fujita | H02M 1/096 |
| 2018/0205335 | A1* | 7/2018 | Dong | H02M 7/797 |
| 2020/0127576 | A1* | 4/2020 | Hayashi | H02M 5/293 |
| 2020/0336081 | A1* | 10/2020 | Yan | H02M 5/14 |

FOREIGN PATENT DOCUMENTS

| | | |
|---|---|---|
| CN | 106849683 A | 6/2017 |
| CN | 206602468 U | 10/2017 |
| CN | 107809184 A | 3/2018 |
| JP | 63-316673 A | 12/1988 |
| JP | 1-238466 A | 9/1989 |
| JP | H0241777 A | 2/1990 |
| JP | 10-75580 A | 3/1998 |
| JP | 10-234186 A | 9/1998 |
| JP | 2015-195722 A | 11/2015 |
| JP | 2016-19298 A | 2/2016 |
| JP | 2016-86581 A | 5/2016 |
| KR | 101478778 B1 | 1/2015 |
| WO | WO 2017/094379 A1 | 6/2017 |

OTHER PUBLICATIONS

International Search Report for PCT Application No. PCT/CN2018/115956 dated Feb. 1, 2019.

European Search Report of corresponding European Application No. 18884228.0 dated Dec. 15, 2020.

Office Action of corresponding European Application No. 18884228.0 dated Feb. 10, 2021.

First Office Action of corresponding Japanese Application No. 2020-545843 dated Jun. 1, 2021.

* cited by examiner

PULSE VOLTAGE GENERATION DEVICE, METHOD, AND CONTROLLER

TECHNICAL FIELD

The present application relates to the field of signal generator technology, specifically to a pulse voltage generation device, method and controller.

BACKGROUND

Pulse voltage technology refers to the generation of high-voltage pulse via relatively long time storage of energy following by rapid release of the energy in a very short time in the form of electrical energy. The pulse voltage technology is essentially to compress the pulse energy on a time scale, so as to obtain high peak voltage output in a short time (nanoseconds to hundreds of microseconds). In order to obtain a good application effect of the pulse voltage technology, it is often required that the rising and falling edges of pulse voltage have a short time, thereby generating pulses with a narrow width.

In the prior art, a high pulse voltage value can be obtained through boosting by the transformer. The pulse voltage generation device used in the prior art is shown in FIG. 1, wherein a half-bridge circuit is connected in parallel at both ends of a direct current voltage source, and the output terminal of the half-bridge circuit is connected to a low-voltage side of the transformer, a high-voltage side of the transformer serves as the pulse voltage output terminal. The half-bridge circuit is controlled to output low-voltage bipolar pulse signals by controlling the switched on and off times of the four controlled switches S10, S20, S30, and S40 of the half-bridge circuit. For example, when the controllable switches S10 and S40 are controlled to be switched on, and S20 and S30 are controlled to be switched off, the current flow on the low-voltage side of the transformer can be made as shown by the arrows in FIG. 1; when the controllable switches S10 and S40 are controlled to be switched off, and S20 and S30 are controlled to be switched on, the current flow on the low-voltage side of the transformer can be made opposite to the direction shown by the arrow in FIG. 1. When the low-voltage side of the boosting transformer is fed with alternating current, the high-voltage side of the transformer will induce a voltage. In FIG. 1, a capacitor C connected in parallel at two ends of the direct current voltage source is used for filtering.

However, because changes in the induced magnetic field of the transformer take a certain time to happen, frequency of the high-voltage pulse is difficult to increase due to limitation, and the rising edge and falling edge of the high-voltage pulse take a longer time.

SUMMARY

In view of this, embodiments of the present application provide a pulse voltage generation device, method and controller to solve the problem that frequency of the high-voltage pulse is difficult to increase due to limitation, and the rising edge and falling edge of the high-voltage pulse take a longer time.

A first aspect of the present application provides a pulse voltage generation device, including: a transformer; a first AC/DC conversion circuit, with an alternating current side connected with a high-voltage side of the transformer; an energy storage capacitor, connected with a direct current side of the a first AC/DC conversion circuit, for storing electrical energy; and a discharge control circuit, in parallel connection with both ends of the energy storage capacitor, for controlling discharge of the energy storage capacitor to generate a high-voltage pulse.

Optionally, the discharge control circuit comprises: a first controllable switch S1, a second controllable switch S2, a third controllable switch S3, a fourth controllable switch S4, a discharge resistance and a first controller; the S1 is in series connection with the S2, and the S3 is in series connection with the S4; the discharge resistance has one end connected between the S1 and the S2, and the other end connected between the S3 and the S4; and both ends of the discharge resistance serve as output terminals of the discharge control circuit; and the first controller is used for controlling the S1, the S2, the S3 and the S4 to be switched on or switched off.

Optionally, the device further comprises: a second AC/DC conversion circuit, with an alternating current side connected with a power grid; a DC/AC conversion circuit, with a direct current side connected with a direct current side of the second AC/DC conversion circuit, and an alternating current side connected with a low-voltage side of the transformer.

Optionally, the DC/AC conversion circuit comprises: a fifth controllable switch S5, a sixth controllable switch S6, a seventh controllable switch S7, an eighth controllable switch S8 and a second controller; the S5 is in series connection with the S6, the S7 is in series connection with the S8; an output terminal of the DC/AC conversion circuit has one end connected between the S5 and the S6, and the other end connected between the S7 and the S8; and the second controller is used for controlling the S5, the S6, the S7 and the S8 to be switched on or switched off.

Optionally, a magnetic core of the transformer comprises at least two high-voltage coils, and each of the high-voltage coils is correspondingly connected with one first AC/DC conversion circuit, the first AC/DC conversion circuit is correspondingly connected with at least one energy storage capacitor and a discharge control circuit; two ends of the discharge control circuits with output terminals being connected in parallel serve as an output terminal of the pulse voltage generation device.

Optionally, the transformer comprises at least two magnetic cores; a low-voltage side of each magnetic core is correspondingly connected with a DC/AC conversion circuit, input terminals of multiple DC/AC conversion circuits are connected in parallel with an output terminal of the second AC/DC conversion circuit.

Optionally, the transformer comprises at least two magnetic cores, and input terminals of low-voltage side coils of each magnetic core are connected in parallel with the output terminal of the DC/AC conversion circuit.

Optionally, the controllable switches adopt Si-MOSFET or SiC-MOSFET.

A second aspect of the present application provides a pulse voltage generating method, comprising: controlling application of square wave voltage on a low-voltage side of a transformer, wherein, after being subjected to voltage boosting by the transformer, the square wave voltage is converted to direct current voltage by an AC/DC conversion circuit to charge an energy storage capacitor; and controlling a discharge control circuit connected in parallel with the energy storage capacitor to discharge to generate a high-voltage pulse.

Optionally, the method further comprises: acquiring voltage of the energy storage capacitor; determining whether the voltage of the energy storage capacitor reaches a predetermined value, when it does, controlling the charge of the energy storage capacitor to be ceased.

Optionally, the discharge control circuit comprises: a first controllable switch S1, a second controllable switch S2, a third controllable switch S3, a fourth controllable switch S4, a discharge resistance and a first controller; the S1 is in series connection with the S2, and the S3 is in series connection with the S4; the discharge resistance has one end connected between the S1 and the S2, and the other end connected between the S3 and the S4; one end of the S1 is connected with one end of the S3; and both ends of the discharge resistance serve as output terminals of the discharge control circuit; and the first controller is used for controlling the S1, the S2, the S3 and the S4 to be switched on or switched off. The step of controlling the discharge control circuit in parallel connection with the energy storage capacitor to discharge to generate the high-voltage pulse comprises: acquiring polarity of the pulse voltage required to be outputted; when the pulse voltage required to be outputted is of first polarity, controlling the S1 and the S4 to be switched on and the S2, the S3 to be switched off and remain so for a scheduled period of time, before controlling each of the S1, the S2, the S3 and the S4 to be switched off; when the pulse voltage required to be outputted is of second polarity opposite to the first polarity, controlling the S2 and the S3 to be switched on and the S1 and the S4 to be switched off and remain so for a scheduled period of time, before controlling each of the S1, the S2, the S3 and the S4 to be switched off.

A third aspect of the present application provides a pulse voltage generation device, comprising: a first control unit, for controlling application of square wave voltage on a low-voltage side of a transformer, wherein, after being subjected to voltage boosting by the transformer, the square wave voltage is converted to direct current voltage by an AC/DC conversion circuit to charge an energy storage capacitor; and a second control unit, for controlling a discharge control circuit connected in parallel with the energy storage capacitor to discharge to generate a high-voltage pulse.

Optionally, the device further comprises: an acquisition unit, for acquiring voltage of the energy storage capacitor; a determination unit, for determining whether the voltage of the energy storage capacitor reaches a predetermined value; a third control unit, for controlling the charge of the energy storage capacitor to be ceased when the voltage of the energy storage capacitor reaches the predetermined value.

Optionally, the discharge control circuit comprises: a first controllable switch S1, a second controllable switch S2, a third controllable switch S3, a fourth controllable switch S4, a discharge resistance and a first controller; the S1 is in series connection with the S2, and the S3 is in series connection with the S4; the discharge resistance has one end connected between the S1 and the S2, and the other end connected between the S3 and the S4; one end of the S1 is connected with one end of the S3; and both ends of the discharge resistance serve as output terminals of the discharge control circuit; and the first controller is used for controlling the S1, the S2, the S3 and the S4 to be switched on or switched off. The second control unit comprises: an acquisition subunit, for acquiring polarity of the pulse voltage required to be outputted; a first control subunit, for controlling the S1 and the S4 to be switched on and the S2, the S3 to be switched off and remain so for a scheduled period of time, when the pulse voltage required to be outputted is of first polarity, before controlling each of the S1, the S2, the S3 and the S4 to be switched off; a second control subunit, for controlling the S2 and the S3 to be switched on and the S1 and the S4 to be switched off and remain so for a scheduled period of time when the pulse voltage required to be outputted is of second polarity opposite to the first polarity, before controlling each of the S1, the S2, the S3 and the S4 to be switched off.

A fourth aspect of the present application provides a controller, comprising memory and a processor, wherein the memory stores computer program, which, when executed by the processor, performs the pulse voltage generating method in the second aspect or any alternative implementation thereof.

In the pulse voltage generation device, method and controller provided by the embodiment of the present application, an energy storage capacitor is arranged on a high-voltage side of the transformer, and a discharge control circuit is used to control the energy storage capacitor to discharge to generate a high-voltage pulse, avoiding the problem that frequency of the high-voltage pulse outputted on the high-voltage side is limited by variations of the induced magnetic field of the transformer, and is thus difficult to increase, and that the rising edge and falling edge of the high-voltage pulse take a long time.

BRIEF DESCRIPTION OF THE DRAWINGS

The features and advantages of the present application will be more clearly understood by referring to the drawings. The drawings are schematic and should not be construed as limiting the present application. In the drawings.

DETAILED DESCRIPTION

In order to make the purpose, technical solutions and advantages of embodiments of the present application clearer, the technical solutions in the embodiments of the present application will be described as follows clearly and completely referring to figures accompanying the embodiments of the present application, and apparently, the described embodiments are just part rather than all embodiments of the present application. Based on the embodiments of the present application, all the other embodiments acquired by those skilled in the art without delivering creative efforts shall fall into the protection scope of the present application.

Embodiment 1

Figure 1:
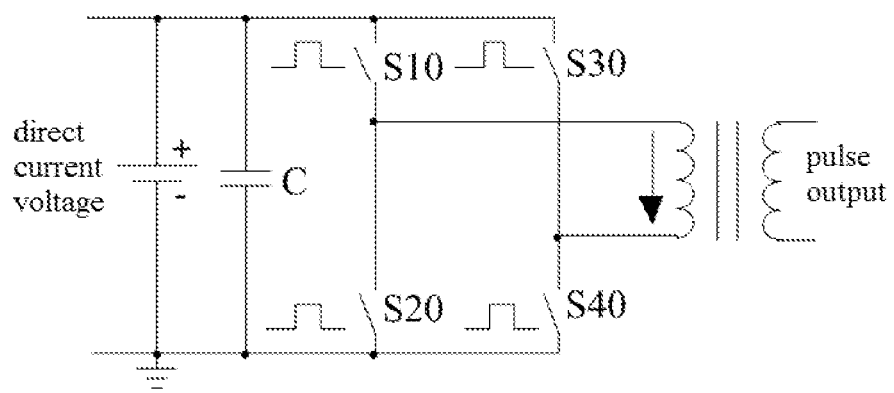
FIG. 1 shows a circuit schematic diagram of an existing pulse voltage generation device.
Figure 2:
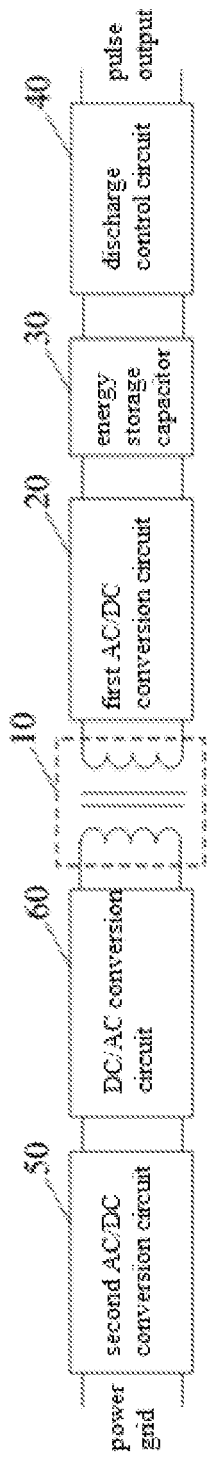
FIG. 2 shows a functional block diagram of a pulse voltage generation device according to an embodiment of the present application.

FIG. 2 shows a functional block diagram of a pulse voltage generation device according to an embodiment of the present application. The device comprises a transformer 10, a first AC/DC conversion circuit 20, an energy storage capacitor 30 and a discharge control circuit 40.

A low square wave voltage is applied on a low-voltage side of the transformer 10. An alternating current side of the first AC/DC conversion circuit 20 is connected with a high-voltage side of the transformer 10. The energy storage capacitor 30 is a device comprising a capacitor (also referred to as an energy storage capacitor), mainly functioning to store electrical energy, unlike a simple capacitor which functions to filter, and is connected with a direct current side of the first AC/DC conversion circuit 20. The discharge control circuit 40 is connected with both ends of the energy storage capacitor 30 in parallel, for controlling the energy storage capacitor 30 to discharge to generate a high-voltage pulse.

In the above pulse voltage generation device, the energy storage capacitor is arranged on a high-voltage side of the transformer, and a discharge control circuit is used to control the energy storage capacitor to discharge to generate a high-voltage pulse, avoiding the problem that frequency of the high-voltage pulse outputted on the high-voltage side is limited by variations of the induced magnetic field of the transformer, and is thus difficult to be increased, and that the rising edge and falling edge of the high-voltage pulse take a long time.

Embodiment 2

Figure 3:
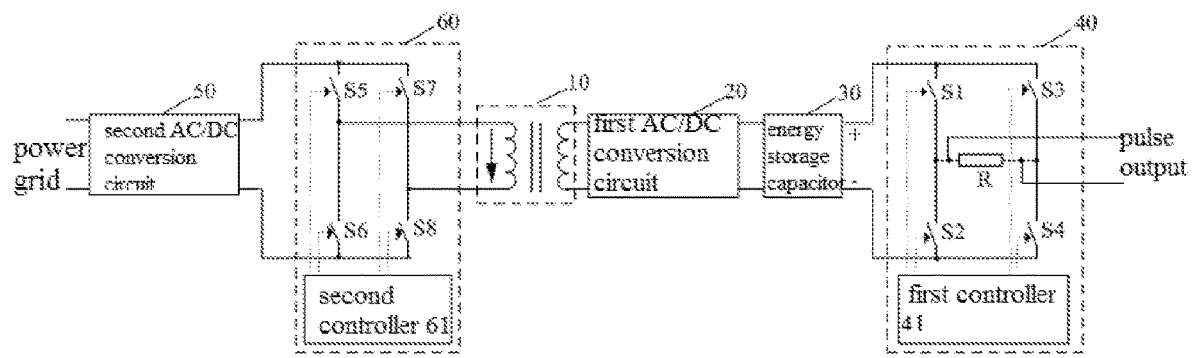
FIG. 3 shows a functional block diagram of a further pulse voltage generation device according to an embodiment of the present application.

FIG. 3 shows a functional block diagram of a further pulse voltage generation device according to an embodiment of the present application. This embodiment differs from embodiment 1 in that the discharge control circuit 40 comprises a first controllable switch S1, a second controllable switch S2, a third controllable switch S3, a fourth controllable switch S4, a discharge resistance R and a first controller 41. The S1 is in series connection with the S2, and the S3 is in series connection with the S4, the discharge resistance R has one end connected between the S1 and the S2, and the other end connected between the S3 and the S4, constituting an H bridge circuit; and both ends of the discharge resistance R serve as output terminals of the discharge control circuit 40, i.e., the voltage between two ends of the discharge resistance R is outputted as the high-voltage pulse. The first controller 41 is used to control the S1, S2, S3 and S4 to be switched on or switched off, so that the output voltage can be bipolar, i.e., the output voltage can be both positive and negative.

Due to the low frequency of the grid voltage, it is difficult to quickly charge the energy storage capacitor 30 if the low-voltage side of the transformer is directly connected, so that the pulse voltage generation device is difficult to output a high-frequency pulse high-voltage. For this reason, the device may also include a second AC/DC conversion circuit 50 and a DC/AC conversion circuit 60, with an alternating current side of second AC/DC conversion circuit 50 connected to the grid, and a direct current side of the DC/AC conversion circuit 60 connected to a direct current side of the second AC/DC conversion circuit 50, whose alternating current side is connected to a low-voltage side of the transformer 10. The second AC/DC conversion circuit first converts the low-frequency grid voltage to direct current voltage, which is then converted through the DC/AC conversion circuit into high-frequency square wave voltage for fast charging of the energy storage capacitor.

As an optional implementation of this embodiment, as shown in FIG. 3, the DC/AC conversion circuit 60 includes a fifth controllable switch S5, a sixth controllable switch S6, a seventh controllable switch S7, an eighth controllable switch S8 and a second controller 61. The S5 is in series connection with the S6, the S7 is in series connection with the S8, an output terminal of the DC/AC conversion circuit 60 has one end connected between S5 and S6, and the other end connected between the S7 and the S8. The second controller 61 is used to control the S5, the S6, the S7 and the S8 to be switched on or switched off, and can convert the direct current voltage into unipolar or bipolar square wave voltage to be outputted.

Figure 4:
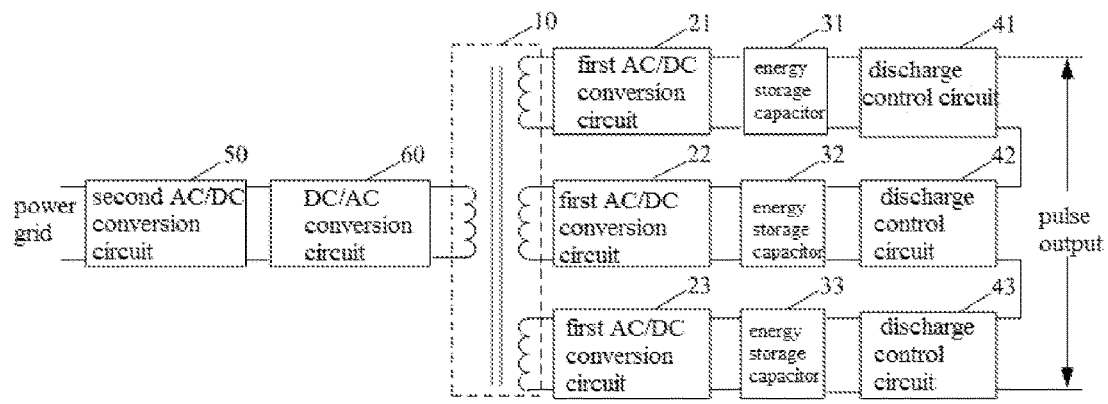
FIG. 4 shows a functional block diagram of another pulse voltage generation device according to an embodiment of the present application.

As an optional embodiment of the embodiment, as shown in FIG. 4, a magnetic core of the transformer 10 includes at least two high-voltage coils. Each high-voltage coil is correspondingly connected with the first AC/DC conversion circuit (for example 21, 22 and 23), which is correspondingly connected with at least one energy storage capacitor (such as 31, 32 and 33) and discharge control circuit 40 (such as 41, 42 and 43). The output terminal of the discharge control circuit 40 is connected in parallel. The terminal is used as the output terminal of the pulse voltage generation device. Two ends of the discharge control circuits 40 with output terminals being connected in parallel serve as an output terminal of the pulse voltage generation device.

Figure 5:
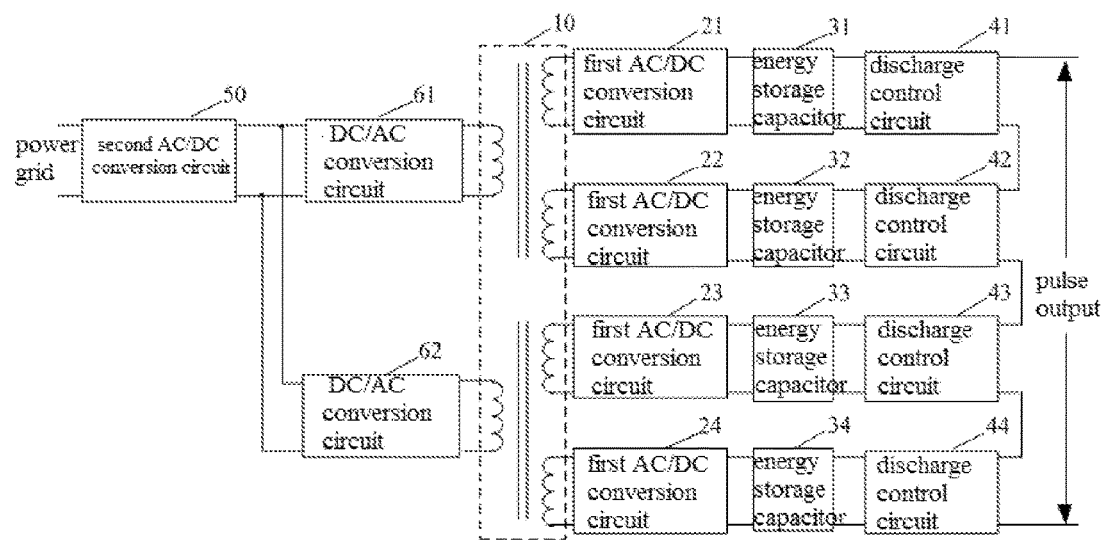
FIG. 5 shows a functional block diagram of yet another pulse voltage generation device according to an embodiment of the present application.
Figure 6:
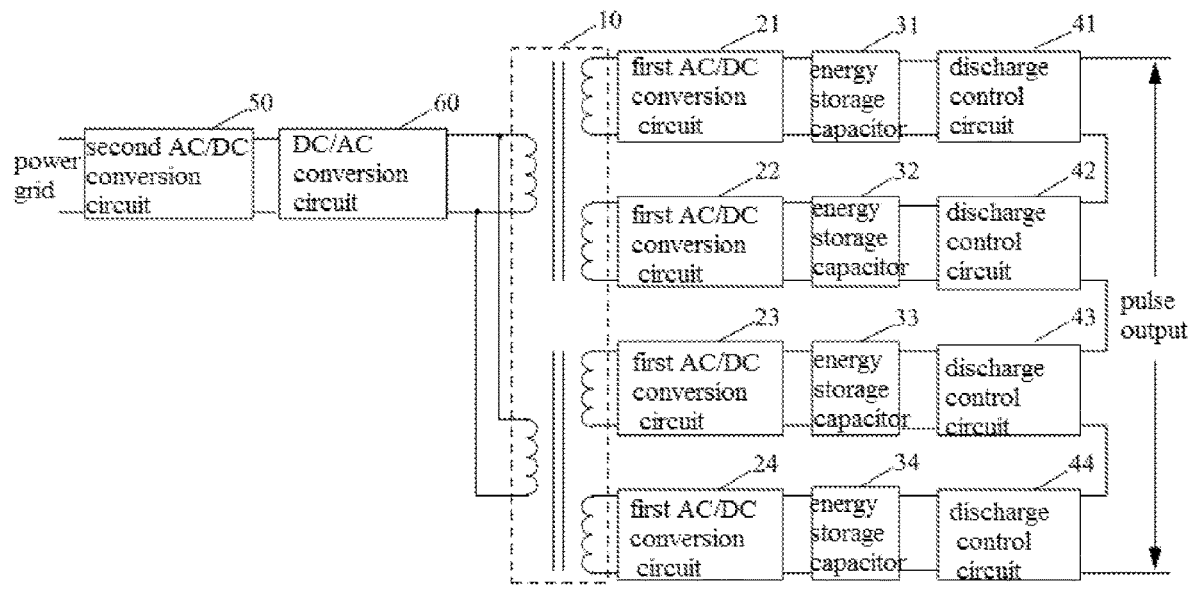
FIG. 6 shows a functional block diagram of yet another pulse voltage generation device according to an embodiment of the present application.

As an optional implementation of the embodiment, as shown in FIG. 5, the transformer 10 includes at least two magnetic cores, a low-voltage side of each magnetic core is correspondingly connected with a DC/AC conversion circuit (such as 61 and 62), and input terminals of multiple DC/AC conversion circuits 60 are connected in parallel to the output terminal of the second AC/DC conversion circuit 50. Alternatively, as an alternative implementation of this optional implementation, as shown in FIG. 6, the transformer 10 includes at least two magnetic cores, the input terminal of the low-voltage side coil of each magnetic core is connected in parallel to the output terminal of DC/AC conversion circuit 60.

Optionally, the controllable switch in the present application can use Si-MOSFET or SiC-MOSFET with low on-resistance and switching loss, and high switching frequency. The inventor's experimental research shows that rising edge and falling edge of the high-voltage pulse outputted by the device using Si-MOSFET can take a time of less than 1 µs, or 100 ns, and less than 10 ns in the case of Si-MOSFET.

The above pulse voltage generation device can avoid the problem that frequency of the high-voltage pulse is limited and thus difficult to increase, and that the rising edge and falling edge of the high-voltage pulse take a long time, referring to embodiment 1 for more details.

Embodiment 3

Figure 7:
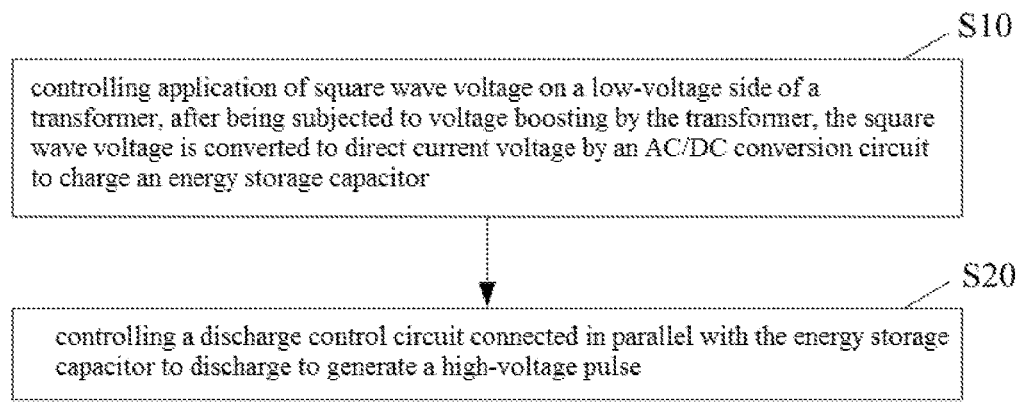
FIG. 7 shows a flowchart of a pulse voltage generating method implemented according to the present application.

FIG. 7 shows a flowchart of a pulse voltage generating method implemented according to the present application, which can be performed by the pulse voltage generation device in embodiment 1 or embodiment 2 or any optional implementation thereof. As shown in FIG. 7, the method includes the following steps:

S10: controlling application of square wave voltage on a low-voltage side of a transformer, after being subjected to voltage boosting by the transformer, the square wave voltage is converted to direct current voltage by an AC/DC conversion circuit to charge an energy storage capacitor.

S20: controlling a discharge control circuit connected in parallel with the energy storage capacitor to discharge to generate a high-voltage pulse.

In the above pulse voltage generation device, the energy storage capacitor is arranged on a high-voltage side of the transformer, and a discharge control circuit is used to control the energy storage capacitor to discharge to generate a high-voltage pulse, avoiding the problem that frequency of the high-voltage pulse outputted on the high-voltage side is limited by variations of the induced magnetic field of the transformer, and is thus difficult to be increased, and that the rising edge and falling edge of the high-voltage pulse take a long time.

Embodiment 4

Figure 8:
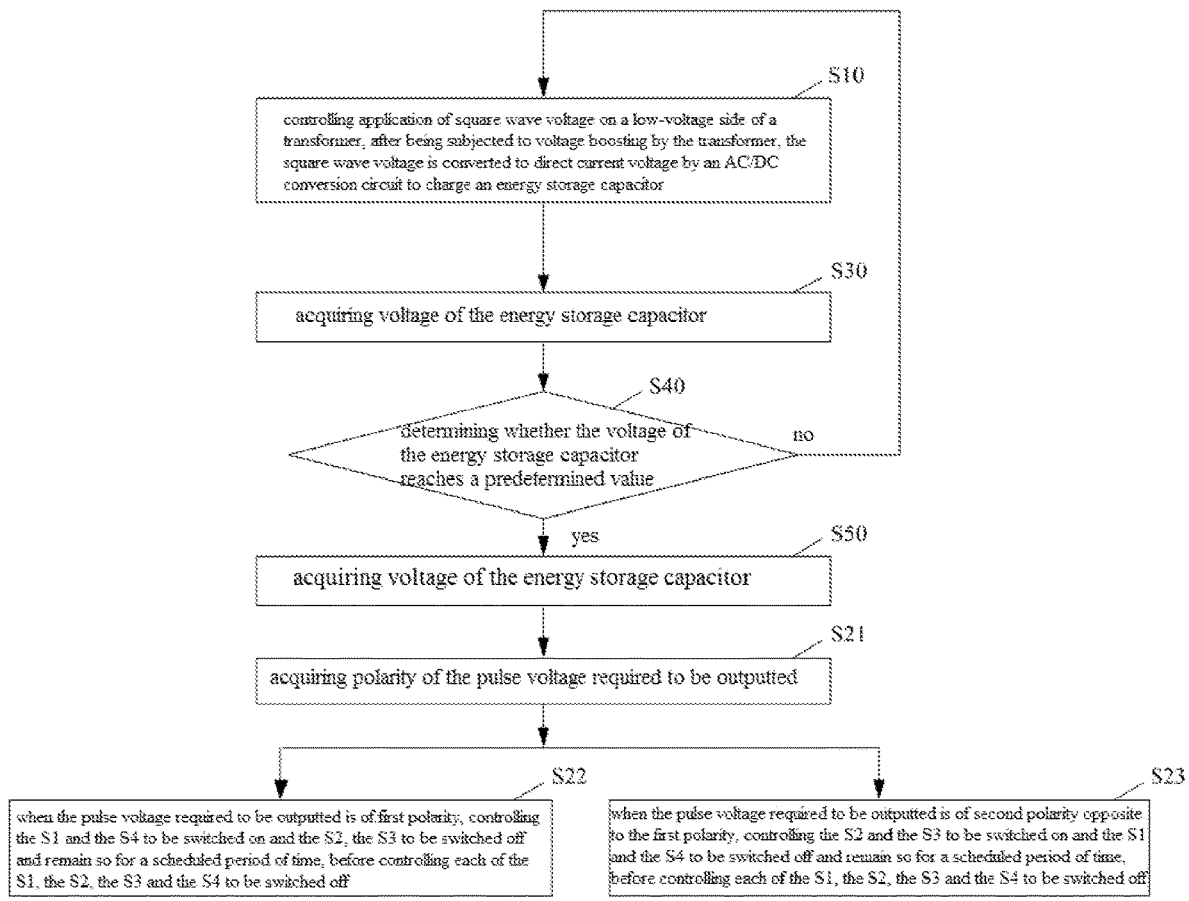
FIG. 8 shows a flowchart of a further pulse voltage generating method according to the present application.

FIG. 8 shows a flowchart of a further pulse voltage generating method according to the present application, which can be performed via embodiment 1 or embodiment 2 or any optional implementation thereof of the pulse voltage generation device. The method differs from embodiment 3 in further comprising the following steps:

S30: acquiring voltage of the energy storage capacitor.

S40: determining whether the voltage of the energy storage capacitor reaches a predetermined value, and when it does, performing step S50; otherwise performing step S10.

S50: controlling the charge of the energy storage capacitor to be ceased, there are lots of methods to do so and will not be defined in the present application.

The energy storage capacitor has a large capacity, and in the above steps S30, S40 and S50, the charge of the energy storage capacitor is controlled to be ceased when the voltage of the energy storage capacitor reaches a predetermined value, so that the value of the pulse high-voltage eventually outputted can be adjusted.

Optionally, the discharge control circuit adopts the circuit structure shown in FIG. 3, wherein one end of S1 is connected to one end of S3. Then step S20 in embodiment 3 includes the following steps:

S21: acquiring polarity of the pulse voltage required to be outputted;

The polarity of the pulse voltage required to be outputted can be input by a user, or it can be a demand generated by other programs.

S22: when the pulse voltage required to be outputted is of first polarity, controlling the S1 and the S4 to be switched on and the S2, the S3 to be switched off and remain so for a scheduled period of time, before controlling each of the S1, the S2, the S3 and the S4 to be switched off.

S23: when the pulse voltage required to be outputted is of second polarity opposite to the first polarity, controlling the S2 and the S3 to be switched on and the S1 and the S4 to be switched off and remain so for a scheduled period of time, before controlling each of the S1, the S2, the S3 and the S4 to be switched off.

For example, assume it is positive voltage in FIG. 3 when the potential on the left end of the discharge resistance R is higher than that on the right end. When the pulse voltage required to be outputted is positive, the S1 and S4 can be switched on and the S2 and S3 can be switched off and remain so for a very short time, before the S1, S2, S3 and S4 are each controlled to be switched off, so as to output positive pulse high-voltage, i.e., step S22, which is executed once to output a positive pulse high-voltage. Optionally, step S22 can be executed multiple times to continuously output positive pulse high-voltages. Step S23, which is similar to step S22, can be understood by those skilled in the art according to the description herein, and will not be repeated.

Through the above steps S21, S22 and S23, pulse high-voltages of the required polarity or dual polarity can be outputted, and pulse high-voltages can also be continuously output.

Optionally, the frequency by which the controllable switch controls the change of signals can be controlled when controlling the above controllable switches S1, S2, S3 and S4, thereby controlling the duty cycle of the final high-voltage pulse eventually outputted.

The above pulse voltage generation method can avoid the problem that frequency of the high-voltage pulse is limited and thus difficult to increase, and that the rising edge and falling edge of the high-voltage pulse take a long time, referring to embodiment 3 for more details.

Embodiment 5

Figure 9:
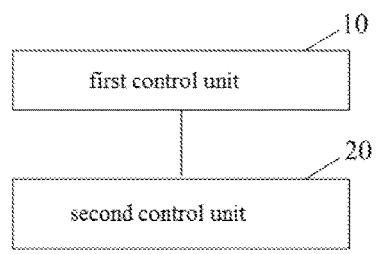
FIG. 9 shows a functional block diagram of a pulse voltage generation device according to an embodiment of the present application.

FIG. 9 shows a functional block diagram of a pulse voltage generation device according to an embodiment of the present application, the device can be used to perform the pulse voltage generating method in embodiment 3 or embodiment 4 or any optional implementation thereof. As shown in FIG. 9, the device comprises a first control unit 10 and a second control unit 20.

The first control unit 10 is used for controlling application of square wave voltage on a low-voltage side of a transformer, after being subjected to voltage boosting by the transformer, the square wave voltage is converted to direct current voltage by an AC/DC conversion circuit to charge an energy storage capacitor.

The second control unit 20 is used for controlling a discharge control circuit connected in parallel with the energy storage capacitor to discharge to generate a high-voltage pulse.

The above pulse voltage generation device can avoid the problem that frequency of the high-voltage pulse is limited and thus difficult to increase, and that the rising edge and falling edge of the high-voltage pulse take a long time, referring to embodiment 3 for more details.

Embodiment 6

Figure 10:
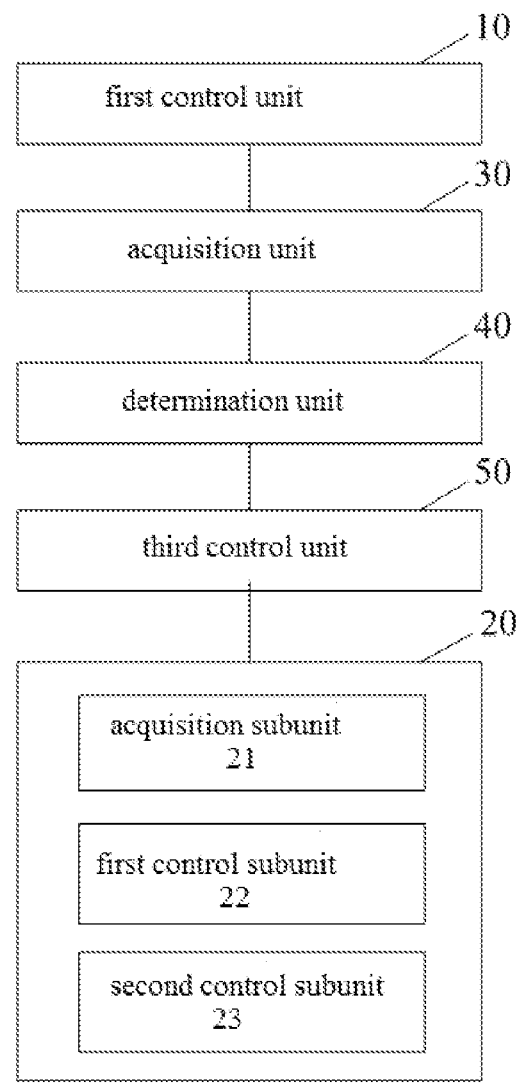
FIG. 10 shows a functional block diagram of another pulse voltage generation device according to an embodiment of the present application.

FIG. 10 shows a functional block diagram of another pulse voltage generation device according to an embodiment of the present application, the device can be used to perform the pulse voltage generation method in embodiment 3 or embodiment 4 or any optional implementation thereof. As shown in FIG. 10, embodiment 6 differs from embodiment 5 in further comprising an acquisition unit 30, a determination unit 40 and a third control unit 50. The acquisition unit 30 is used for acquiring voltage of the energy storage capacitor. The determination unit 40 is used for determining whether the voltage of the energy storage capacitor reaches a predetermined value. The third control unit 50 is used for controlling the charge of the energy storage capacitor to be ceased when the voltage of the energy storage capacitor reaches the predetermined value.

Optionally, the discharge control circuit adopts the circuit structure as shown in FIG. 3, where one end of S1 is connected to one end of S3. Then the second control unit 20 in embodiment 5 may comprise an acquisition subunit 21, a first control subunit 22 and a second control subunit 23. The acquisition subunit 21 is used to acquire polarity of the pulse voltage required to be outputted. The first control subunit 22 is used for controlling the S1 and the S4 to be switched on and the S2, the S3 to be switched off and remain so for a scheduled period of time, when the pulse voltage required to be outputted is of first polarity, before controlling each of the S1, the S2, the S3 and the S4 to be switched off. The second control subunit 23 is used for controlling the S2 and the S3 to be switched on and the S1 and the S4 to be switched off and remain so for a scheduled period of time, before controlling each of the S1, the S2, the S3 and the S4 to be switched off.

The above pulse voltage generation method can avoid the problem that frequency of the high-voltage pulse is limited and thus difficult to increase, and that the rising edge and falling edge of the high-voltage pulse take a long time, referring to embodiment 3 for more details.

An embodiment of the present application also provides a controller, comprising memory and a processor, wherein the memory stores computer program, which, when executed by the processor, performs the pulse voltage generating method in embodiment 3 or embodiment 4 or any alternative implementation thereof.

Although the embodiments of the present application have been described in junctions with the drawings, for one with ordinary skill in the art, various modifications and variations can be made to these embodiments without departing from the principle and spirit of the present application, all such modifications and variations fall into the scope of the appended claims.

What is claimed is:

1. A pulse voltage generation device, comprising:
   a transformer;
   a first AC/DC conversion circuit, with an alternating current side connected with a high-voltage side of the transformer;
   an energy storage capacitor, connected with a direct current side of the first AC/DC conversion circuit, for storing electrical energy;
   a discharge control circuit, in parallel connection with both ends of the energy storage capacitor, for controlling discharge of the energy storage capacitor to generate a high-voltage pulse; and
   a magnetic core of the transformer comprises at least two high-voltage coils, and each of the high-voltage coils is correspondingly connected with one first AC/DC conversion circuit, the first AC/DC conversion circuit is correspondingly connected with at least one energy storage capacitor and a discharge control circuit; two ends of the discharge control circuits with output terminals being connected in parallel serve as an output terminal of the pulse voltage generation device.

2. The pulse voltage generation device of claim 1, wherein, the discharge control circuit comprises:
   a first controllable switch S1, a second controllable switch S2, a third controllable switch S3, a fourth controllable switch S4, a discharge resistance and a first controller;
   the S1 is in series connection with the S2, and the S3 is in series connection with the S4;
   the discharge resistance has one end connected between the S1 and the S2, and the other end connected between the S3 and the S4; and both ends of the discharge resistance serve as output terminals of the discharge control circuit; and
   the first controller is used for controlling the S1, the S2, the S3 and the S4 to be switched on or switched off.

3. The pulse voltage generation device of claim 1, further comprising:
   a second AC/DC conversion circuit, with an alternating current side connected with a power grid;
   a DC/AC conversion circuit, with a direct current side connected with a direct current side of the second AC/DC conversion circuit, and an alternating current side connected with a low-voltage side of the transformer.

4. The pulse voltage generation device of claim 3, wherein, the DC/AC conversion circuit comprises:
   a fifth controllable switch S5, a sixth controllable switch S6, a seventh controllable switch S7, an eighth controllable switch S8 and a second controller;
   the S5 is in series connection with the S6, the S7 is in series connection with the S8; an output terminal of the DC/AC conversion circuit has one end connected between the S5 and the S6, and the other end connected between the S7 and the S8; and
   the second controller is used for controlling the S5, the S6, the S7 and the S8 to be switched on or switched off.

5. The pulse voltage generation device of claim 3, wherein, the transformer comprises at least two magnetic cores, a low-voltage side of each magnetic core is correspondingly connected with a DC/AC conversion circuit, input terminals of multiple DC/AC conversion circuits are connected in parallel with an output terminal of the second AC/DC conversion circuit.

6. The pulse voltage generation device of claim 3, wherein, the transformer comprises at least two magnetic cores, and input terminals of low-voltage side coils of each magnetic core are connected in parallel with the output terminal of the DC/AC conversion circuit.

7. The pulse voltage generation device of claim 1, wherein, the discharge control circuit comprises controllable switches which adopt Si-MOSFET or SiC-MOSFET.

8. A pulse voltage generating method, used in the pulse voltage generation device of claim 1, comprising:
   controlling application of square wave voltage on a low-voltage side of a transformer, wherein, after being subjected to voltage boosting by the transformer, the square wave voltage is converted to direct current voltage by an AC/DC conversion circuit to charge an energy storage capacitor; and
   controlling a discharge control circuit connected in parallel with the energy storage capacitor to discharge to generate a high-voltage pulse.

9. A controller, comprising memory and a processor, wherein the memory stores computer program, wherein, the computer program, when executed by the processor, performing the pulse voltage generating method of claim 8.

10. The pulse voltage generation device of claim 1, wherein, the transformer comprises at least two magnetic cores, a low-voltage side of each magnetic core is correspondingly connected with a DC/AC conversion circuit, input terminals of multiple DC/AC conversion circuits are connected in parallel with an output terminal of the second AC/DC conversion circuit.

11. The pulse voltage generation device of claim 1, wherein, the transformer comprises at least two magnetic cores, and input terminals of low-voltage side coils of each magnetic core are connected in parallel with the output terminal of the DC/AC conversion circuit.

\* \* \* \* \*